(12) United States Patent
Nakatani et al.

(10) Patent No.: US 11,183,382 B2
(45) Date of Patent: Nov. 23, 2021

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Kimihiko Nakatani, Toyama (JP); Yoshitomo Hashimoto, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 173 days.

(21) Appl. No.: 16/699,423

(22) Filed: Nov. 29, 2019

(65) Prior Publication Data

US 2020/0176249 A1 Jun. 4, 2020

(30) Foreign Application Priority Data

Nov. 30, 2018 (JP) .............................. JP2018-226048

(51) Int. Cl.
*H01L 21/31* (2006.01)
*H01L 21/02* (2006.01)
(Continued)

(52) U.S. Cl.
CPC ........ *H01L 21/02337* (2013.01); *C23C 16/36* (2013.01); *C23C 16/4583* (2013.01);
(Continued)

(58) Field of Classification Search
CPC ......... H01L 21/02164; H01L 21/02203; H01L 21/02208; H01L 21/02219;
(Continued)

(56) References Cited

U.S. PATENT DOCUMENTS

2006/0054990 A1  3/2006 Matsumura et al.
2014/0179085 A1* 6/2014 Hirose .............. C23C 16/45544
                                                          438/478
(Continued)

FOREIGN PATENT DOCUMENTS

JP     2005-044969 A    2/2005
JP     2014-127524 A    7/2014
(Continued)

OTHER PUBLICATIONS

Japanese Office Action dated Feb. 16, 2021 for Japanese Patent Application No. 2018-226048.

*Primary Examiner* — Brook Kebede
(74) *Attorney, Agent, or Firm* — Volpe Koenig

(57) ABSTRACT

There is provided a technique that includes: (a) forming a first film containing boron and at least first bonds selected from the group of Si—C bonds and Si—N bonds on a substrate by performing a cycle a predetermined number of times, the cycle including non-simultaneously performing: supplying a boron-containing pseudo-catalyst gas to the substrate; and supplying a first precursor gas containing at least the first bonds selected from the group of the Si—C bonds and the Si—N bonds to the substrate; (b) modifying the first film to a second film by supplying a gas containing hydrogen and oxygen to the substrate; and (c) modifying the second film to a third film by performing a thermal annealing process to the second film.

21 Claims, 8 Drawing Sheets

(51) Int. Cl.
*C23C 16/458* (2006.01)
*C23C 16/56* (2006.01)
*C23C 16/46* (2006.01)
*C23C 16/36* (2006.01)

(52) U.S. Cl.
CPC .............. *C23C 16/46* (2013.01); *C23C 16/56* (2013.01); *H01L 21/0228* (2013.01); *H01L 21/02164* (2013.01); *H01L 21/02203* (2013.01); *H01L 21/02208* (2013.01); *H01L 21/02219* (2013.01); *H01L 21/02345* (2013.01)

(58) Field of Classification Search
CPC ......... H01L 21/02337; H01L 21/02345; H01L 21/02447; H01L 21/02529; H01L 21/0262; H01L 21/02532; H01L 21/67109; C23C 16/0272; C23C 16/36; C23C 16/45544; C23C 16/45527; C23C 16/4583; C23C 16/46; C23C 16/52; C23C 16/56

USPC ........................................................ 438/778
See application file for complete search history.

(56) References Cited

U.S. PATENT DOCUMENTS

| | | | |
|---|---|---|---|
| 2014/0227886 A1* | 8/2014 | Sano | C23C 16/52 438/762 |
| 2016/0233085 A1* | 8/2016 | Yamaguchi | C23C 16/308 |
| 2018/0023192 A1 | 1/2018 | Chandra et al. | |
| 2018/0204732 A1 | 7/2018 | Kamakura et al. | |

FOREIGN PATENT DOCUMENTS

| | | |
|---|---|---|
| JP | 2014-154809 A | 8/2014 |
| JP | 2018-506185 A | 3/2018 |
| WO | 2015-045099 A1 | 4/2015 |
| WO | 2016-126911 A2 | 8/2016 |
| WO | 2017/046921 A1 | 3/2017 |

\* cited by examiner

FIG. 8A
As-deposited

FIG. 8B
After hygroscopic-site-
eliminating process

FIG. 8C
After thermal
annealing process

FIG. 8D
After exposure to
atmosphere

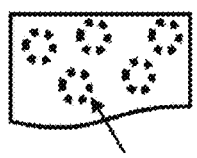
Hygroscopic site

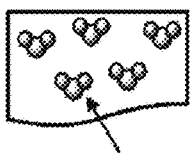
H₂O

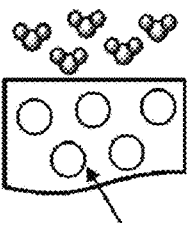
Pore

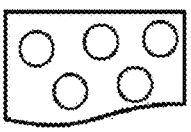

FIG. 9A
As-deposited

FIG. 9B
After exposure to
atmosphere (for short time)

FIG. 9C
After thermal
annealing process

FIG. 9D
After exposure to
atmosphere

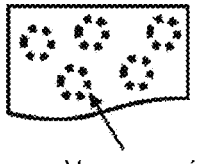
Hygroscopic site

H₂O

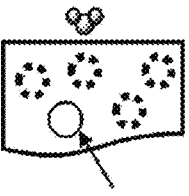
Pore

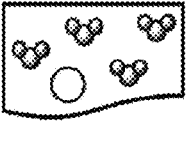

FIG. 10A
As-deposited

FIG. 10B
After exposure to
atmosphere (for long time)

FIG. 10C
After thermal
annealing process

FIG. 10D
After exposure to
atmosphere

Hygroscopic site

H₂O

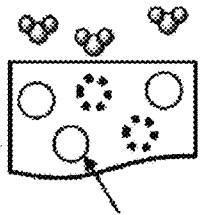
Pore

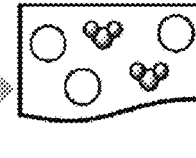

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2018-226048, filed on Nov. 30, 2018, the entire contents of which are incorporated herein by reference.

TECHNICAL FIELD

The present disclosure relates to a method of manufacturing a semiconductor device, a substrate processing apparatus, and a recording medium.

BACKGROUND

As an example of a process of manufacturing a semiconductor device, a process of forming a film on a substrate is often carried out.

SUMMARY

The present disclosure provides some embodiments of a technique capable of improving a quality of a film formed on a substrate.

According to one or more embodiments of the present disclosure, there is provided a technique that includes: (a) forming a first film containing boron and at least first bonds selected from the group of Si—C bonds and Si—N bonds on a substrate by performing a cycle a predetermined number of times, the cycle including non-simultaneously performing: supplying a boron-containing pseudo-catalyst gas to the substrate; and supplying a first precursor gas containing at least the first bonds selected from the group of the Si—C bonds and the Si—N bonds to the substrate; (b) modifying the first film to a second film by supplying a gas containing hydrogen and oxygen to the substrate to react one or more hygroscopic sites in the first film with the gas containing hydrogen and oxygen and eliminate the hygroscopic sites; and (c) modifying the second film to a third film by performing a thermal annealing process to the second film to desorb moisture in the second film.

BRIEF DESCRIPTION OF DRAWINGS

The accompanying drawings, which are incorporated in and constitute a part of the specification, illustrate embodiments of the present disclosure.

FIG. 8A is a schematic enlarged cross sectional view of an as-deposited film, FIG. 8B is a schematic enlarged cross sectional view of a film after a hygroscopic-site-eliminating process is performed on the as-deposited film, FIG. 8C is a schematic enlarged cross sectional view of a film after a thermal annealing process is performed on a film after the hygroscopic-site-eliminating process, and FIG. 8D is a schematic enlarged cross sectional view of a film after the hygroscopic-site-eliminating process and the annealing process are performed is exposed to an atmosphere.

FIG. 9A is a schematic enlarged cross sectional view of an as-deposited film, FIG. 9B is a schematic enlarged cross sectional view of film after the as-deposited film is exposed to the atmosphere (for a short time), FIG. 9C is a schematic enlarged cross sectional view of a film after the thermal annealing process is performed on the film exposed to the atmosphere, and FIG. 9D is a schematic enlarged cross sectional view of a film after the film on which the thermal annealing process is performed is again exposed to the atmosphere.

FIG. 10A is a schematic enlarged cross sectional view of an as-deposited film, FIG. 10B is a schematic enlarged cross sectional view of a film after the as-deposited film is exposed to the atmosphere (for a long time), FIG. 10C is a schematic enlarged cross sectional view of a film after the thermal annealing process is performed on the film exposed to the atmosphere, and FIG. 10D is a schematic enlarged cross sectional view of a film after the film on which the thermal annealing process is performed is again exposed to the atmosphere.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<One or More Embodiments of the Present Disclosure>

Some embodiments of the present disclosure will now be described mainly with reference to FIGS. 1 to 6.

(1) Configuration of the Substrate Processing Apparatus

Figure 1:
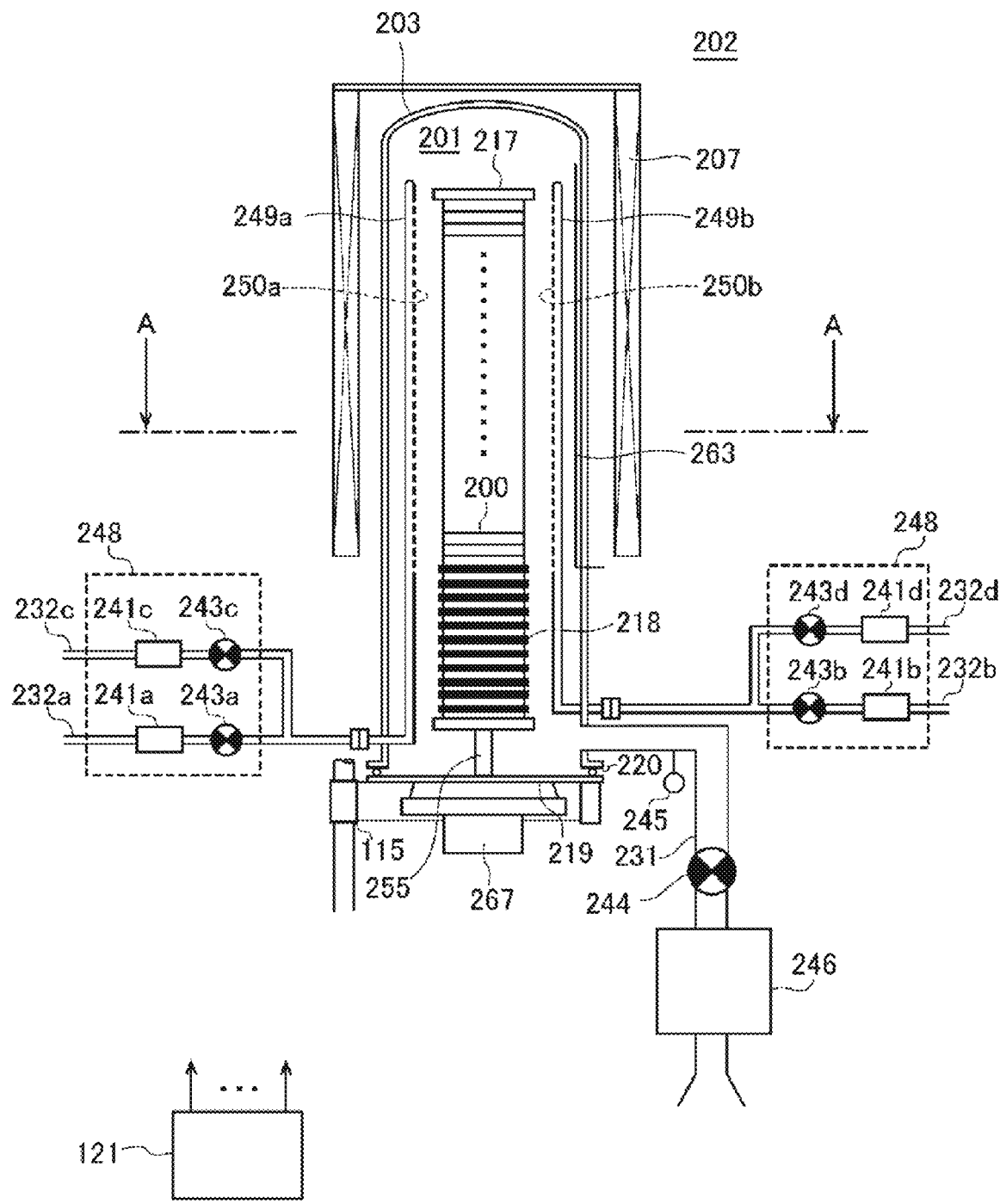
FIG. 1 is a schematic configuration diagram of a vertical type process furnace of a substrate processing apparatus suitably used in embodiments of the present disclosure, in which a portion of the process furnace is shown in a vertical cross sectional view.

As illustrated in FIG. 1, a process furnace 202 includes a heater 207 as a heating mechanism (temperature adjustment part). The heater 207 has a cylindrical shape and is supported by a holding plate so as to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, e.g., quartz ($SiO_2$), silicon carbide (SiC) or the like, and has a cylindrical shape with its upper end closed and its lower end opened. A process chamber 201 as a first process chamber is formed in a hollow cylindrical portion of the reaction tube 203. The process chamber 201 is configured to accommodate wafers 200 as substrates. The process to the wafers 200 is performed in the process chamber 201.

Nozzles 249a and 249b are installed in the process chamber 201 so as to penetrate a lower sidewall of the reaction tube 203. Gas supply pipes 232a and 232b are connected to the nozzles 249a and 249b, respectively.

Mass flow controllers (MFCs) 241a and 241b, which are flow rate controllers (flow rate control parts), and valves 243a and 243b, which are opening/closing valves, are installed in the gas supply pipes 232a and 232b sequentially from the corresponding upstream sides, respectively. Gas supply pipes 232c and 232d are connected to the gas supply pipes 232a and 232b at the downstream side of the valves 243a and 243b, respectively. MFCs 241c and 241d, and valves 243c and 243d are installed in the gas supply pipes 232c and 232d sequentially from the corresponding upstream sides, respectively. The gas supply pipes 232a to 232d are each made of a metal material such as, e.g., stainless steel (SUS) or the like.

Figure 2:
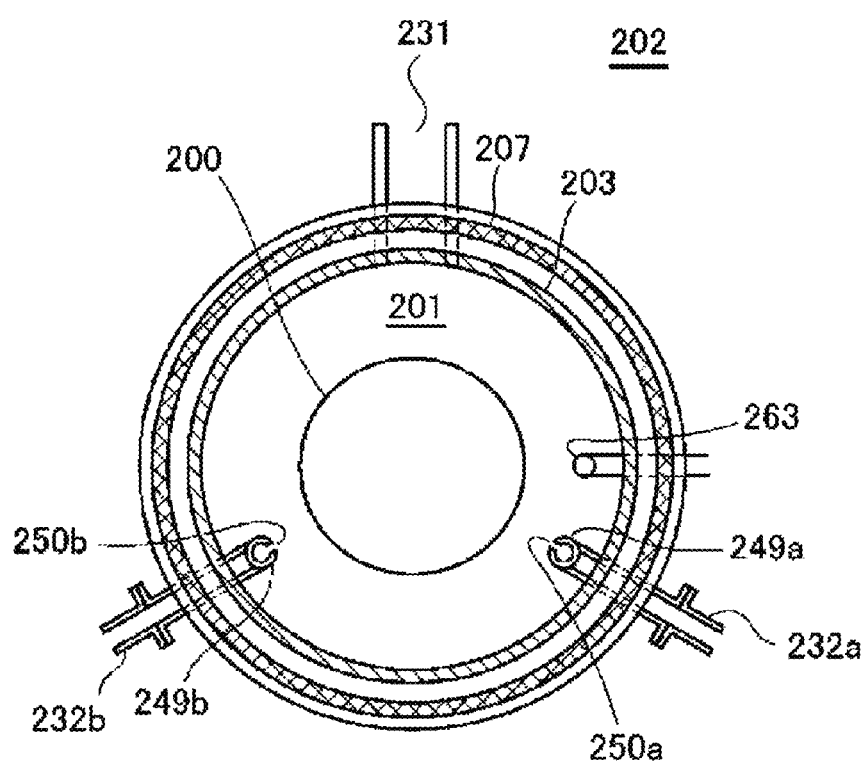
FIG. 2 is a schematic configuration diagram of a vertical type process furnace of the substrate processing apparatus suitably used in embodiments of the present disclosure, in which a portion of the process furnace is shown in a cross sectional view taken along line A-A in FIG. 1.

As illustrated in FIG. 2, the nozzles 249a and 249b are installed in a space with an annular plan-view shape between the inner wall of the reaction tube 203 and the wafers 200 so as to extend along a stacking direction of the wafers 200 from a lower portion of the inner wall of the reaction tube 203 to an upper portion of the inner wall of the reaction tube 203. That is, the nozzles 249a and 249b are installed at a lateral side of a wafer arrangement region in which the wafers 200 are arranged, namely in a region which horizontally surrounds the wafer arrangement region, so as to extend along the wafer arrangement region. Gas supply holes 250a and 250b for supplying a gas are formed on the side surfaces of the nozzles 249a and 249b, respectively. The gas supply holes 250a and 250b are opened toward the center of the reaction tube 203 so as to allow a gas to be supplied toward the wafers 200. The gas supply holes 250a and 250b may be formed in a plural number between the lower portion of the reaction tube 203 and the upper portion of the reaction tube 203. The nozzles 249a and 249b are each made of a heat resistant material such as, e.g., quartz or SiC.

A first precursor (first precursor gas), which contains chemical bonds (Si—C bonds) of silicon (Si), which is a main element constituting a film formed on the wafer 200, and carbon (C) and does not contain halogen such as chlorine (Cl), fluorine (F), bromine (Br), iodine (I) or the like, is supplied from the gas supply pipe 232a into the process chamber 201 via the MFC 241a, the valve 243a, and the nozzle 249a. The precursor gas refers to a gaseous precursor, for example, a gas obtained by vaporizing a precursor which remains in a liquid state under a room temperature and an atmospheric pressure, or a precursor which remains in a gas state under a room temperature and an atmospheric pressure. As the first precursor gas, it may be possible to use, for example, a 1,4-disilabutane ($SiH_3CH_2CH_2SiH_3$, abbreviation: 1,4-DSB) gas. As illustrated in the chemical structural formula in FIG. 6B, 1,4-DSB is a substance containing Si—C bonds, chemical bonds (Si—H bonds) of Si and hydrogen (H), chemical bonds (C—H bonds) of C and H or the like, and contains two Si—C bonds, six Si—H bonds, and four C—H bonds in one molecule. 1,4-DSB contains an ethylene group ($C_2H_4$) as an alkylene group, and is also a precursor not containing an alkyl group, which will be described below. One of four bonding hands of C in 1,4-DSB constitutes a Si—C bond and two of them constitutes C—H bonds. In the present disclosure, 1,4-DSB will be simply referred to as DSB. The DSB acts as a Si source and a C source in a substrate-processing process as described hereinbelow.

Figure 7A:
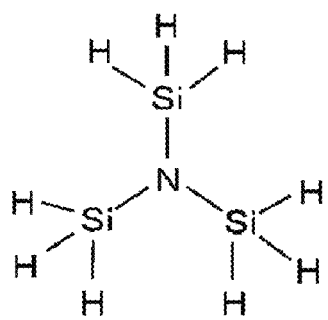
FIG. 7A illustrates a chemical structural formula of trisilylamine.
Figure 7B:
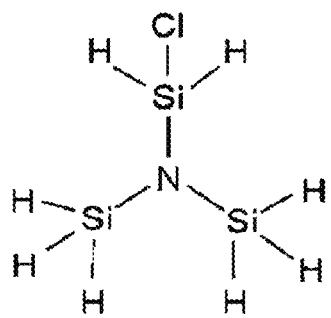
FIG. 7B illustrates a chemical structural formula of monochlorotrisilylamine.

A second precursor (second precursor gas), which contains chemical bonds (Si—N bonds) of Si, which is the main element described above, and nitrogen (N) and does not contain an alkyl group such as a methyl group, an ethyl group, a propyl group, an isopropyl group, a butyl group, an isobutyl group or the like, is supplied from the gas supply pipe 232a into the process chamber 201 via the MFC 241a, the valve 243a, and the nozzle 249a. As the second precursor gas, it may be possible to use, for example, a trisilylamine ($N(SiH_3)_3$, abbreviation: TSA) gas. As illustrated in the chemical structural formula in FIG. 7A, TSA is a substance containing Si—N bonds and Si—H bonds, and contains three Si—N bonds and nine Si—H bonds in one molecule. TSA is also a halogen-free precursor. Three Si are bonded to one N (central element) in TSA. The TSA also acts as a Si source and an N source in the substrate-processing process as described hereinbelow.

A reactant (reaction gas), for example, an oxygen (O)-containing gas, is supplied from the gas supply pipe 232b into the process chamber 201 via the MFC 241b, the valve 243b, and the nozzle 249b. The O-containing gas acts as an oxidizing agent (oxidizing gas), i.e., an O source. As the O-containing gas, it may be possible to use, for example, an oxygen ($O_2$) gas.

A boron-containing pseudo-catalyst gas, for example, a trichloroborane ($BCl_3$) gas, which is a kind of haloborane containing boron (B) and chlorine (Cl), is supplied from the gas supply pipe 232b into the process chamber 201 via the MFC 241b, the valve 243b, and the nozzle 249b. The $BCl_3$ gas exerts a catalytic action that promotes the formation of a film on the wafer 200 in the substrate-processing process as described hereinbelow. The term "catalyst" as used herein refers to a substance in which itself does not change before and after a chemical reaction but changes the rate of the reaction. The $BCl_3$ gas in the reaction system of the present embodiments has a catalytic action that changes the reaction rate or the like, but the $BCl_3$ gas itself may change before and after the chemical reaction. For example, when the $BCl_3$ gas reacts with a DSB gas, a portion of the molecular structure may be decomposed to change itself before and after the chemical reaction. That is, the $BCl_3$ gas in the reaction system of the present embodiments has a catalytic action, but is not strictly a "catalyst." As described above, the substance which acts like a "catalyst" but in which the substance itself changes before and after the chemical reaction will be referred to herein as a "pseudo-catalyst."

A gas containing H and O is supplied as a modifying gas from the gas supply pipe 232b into the process chamber 201 via the MFC 241b, the valve 243b, and the nozzle 249b. As the gas containing H and O, it may be possible to use, for example, water vapor ($H_2O$ gas). The $H_2O$ gas acts to react with one or more hygroscopic sites contained in a first film, which will be described below, so as to eliminate the hygroscopic sites from the first film.

A nitrogen ($N_2$) gas as an inert gas is supplied from the gas supply pipes 232c and 232d into the process chamber 201 via the MFCs 241c and 241d, the valves 243c and 243d, the gas supply pipes 232a and 232b, and the nozzles 249a and 249b. The $N_2$ gas acts as a purge gas, a carrier gas, a dilution gas, or the like.

A first precursor gas supply system and a second precursor gas supply system mainly include the gas supply pipe 232a, the MFC 241a, and the valve 243a. A reactant supply system (an oxidizing agent supply system or an oxidizing gas supply system), a pseudo-catalyst gas supply system, a modifying gas supply system (a gas supply system containing H and O) mainly include the gas supply pipe 232b, the MFC 241b, and the valve 243b. An inert gas supply system mainly includes the gas supply pipes 232c and 232d, the MFCs 241c and 241d, and the valves 243c and 243d.

One or all of various supply systems described above may be configured as an integrated supply system 248 in which the valves 243a to 243d, the MFCs 241a to 241d, and the like are integrated. The integrated supply system 248 is connected to each of the gas supply pipes 232a to 232d so that a supply operation of various kinds of gases into the gas supply pipes 232a to 232d, i.e., an opening/closing operation of the valves 243a to 243d, a flow-rate-adjusting operation by the MFCs 241a to 241d or the like, is controlled by a controller 121 which will be described below. The integrated supply system 248 is configured as an integral type or division type integrated unit, and is also configured so that it is detachable from the gas supply pipes 232a to 232d or the like, so as to perform maintenance, replacement, expansion or the like of the integrated supply system 248, on an integrated unit basis.

An exhaust pipe 231 configured to exhaust an internal atmosphere of the process chamber 201 is installed at a lower side of the sidewall of the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system mainly includes the exhaust pipe 231, the pressure sensor 245, and the APC valve 244. The vacuum pump 246 may be regarded as being included in the exhaust system.

A seal cap 219, which serves as a furnace opening cover configured to hermetically seal a lower end opening of the reaction tube 203, is installed under the reaction tube 203. The seal cap 219 is made of a metal material such as, e.g., stainless steel (SUS) or the like, and is formed in a disc shape. An O-ring 220, which is a seal member making contact with the lower end portion of the reaction tube 203, is installed on an upper surface of the seal cap 219. A rotation mechanism 267 configured to rotate a boat 217, which will be described below, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads and unloads (transfers) the wafers 200 into and from (out of) the process chamber 201 by moving the seal cap 219 up and down.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat-insulating plates 218 made of a heat resistant material such as quartz or SiC are installed below the boat 217 in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
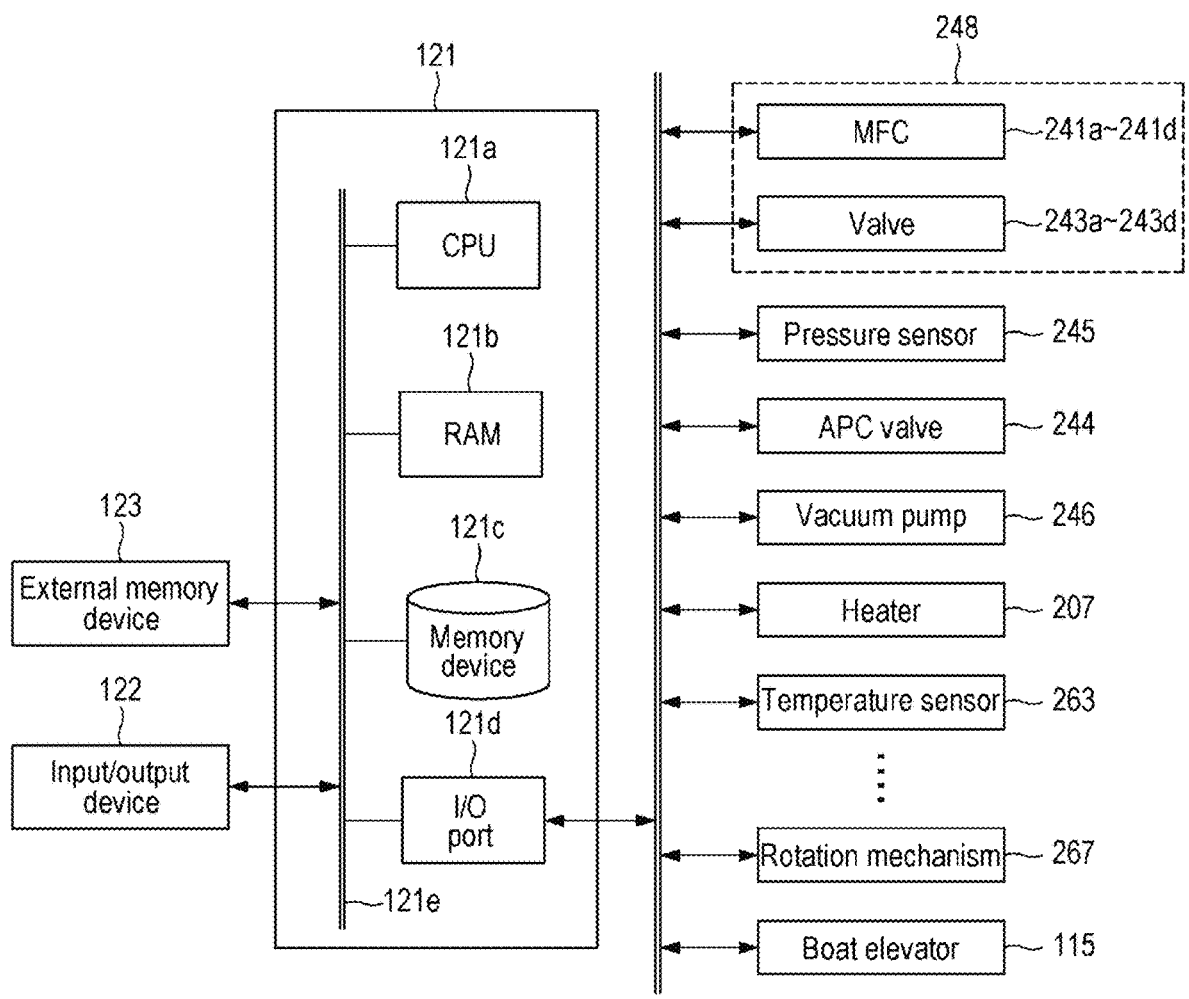
FIG. 3 is a schematic configuration diagram of a controller of the substrate processing apparatus suitably used in embodiments of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of a film-forming process as described hereinbelow, or the like is readably stored in the memory device 121c. The process recipe functions as a program for causing the controller 121 to execute each sequence in the film-forming process, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data or the like read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, and the like, as described above.

The CPU 121a is configured to read the control program from the memory device 121c and execute the same. The CPU 121a is also configured to read the recipe from the memory device 121c according to an input of an operation command from the input/output device 122. In addition, the CPU 121a is configured to control, according to the contents of the recipe thus read, the flow-rate-adjusting operation of various kinds of gases by the MFCs 241a to 241d, the opening/closing operation of the valves 243a to 243d, the opening/closing operation of the APC valve 244, the pressure-regulating operation performed by the APC valve 244 based on the pressure sensor 245, the driving and stopping of the vacuum pump 246, the temperature-adjusting operation performed by the heater 207 based on the temperature sensor 263, the operations of rotating the boat 217 and adjusting the rotation speed of the boat 217 by the rotation mechanism 267, the operation of moving the boat 217 up and down by the boat elevator 115, and the like.

The controller 121 may be configured by installing, on the computer, the aforementioned program stored in an external memory device 123. The external memory device 123 may include, for example, a magnetic disc such as a HDD, an optical disc such as a CD, a magneto-optical disc such as an MO, a semiconductor memory such as a USB memory, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate-Processing Process

A substrate-processing sequence example of forming a film on a wafer 200 as a substrate, modifying the film formed on the wafer 200, and annealing the modified film using the aforementioned substrate processing apparatus, which is a process for manufacturing a semiconductor device, will be described mainly with reference to FIGS. 4 and 5. In the following descriptions, the operations of the respective parts constituting the substrate processing apparatus are controlled by the controller 121.

Figure 4:
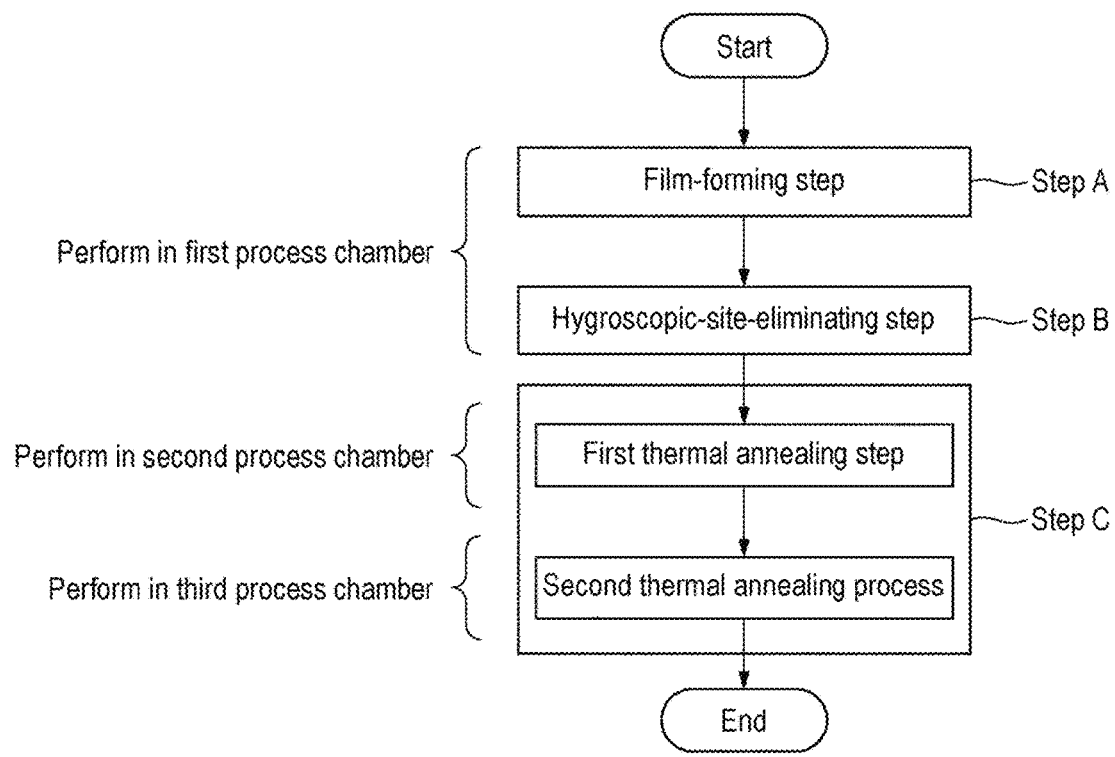
FIG. 4 is a diagram illustrating a substrate-processing sequence according to embodiments of the present disclosure.

In the substrate-processing sequence illustrated in FIG. 4, there are performed: a step A of forming a first film containing B and at least one selected from the group of Si—C bonds and Si—N bonds on a wafer 200 by performing a cycle a predetermined number of times, the cycle including non-simultaneously performing a step of supplying a B-containing pseudo-catalyst gas to the wafer 200, and a step of supplying a first precursor gas containing at least one selected from the group of the Si—C bonds and the Si—N bonds to the wafer 200 (film-forming step); a step B of eliminating one or more hygroscopic sites in the first film by supplying a gas containing H and O to the wafer 200 to react the hygroscopic sites in the first film with the gas containing H and O, to thereby modify the first film into a second film (hygroscopic-site-eliminating step); and a step C of performing a thermal annealing process to the second film to desorb moisture in the second film, to thereby modify the second film into a third film (thermal annealing step).

Figure 5:
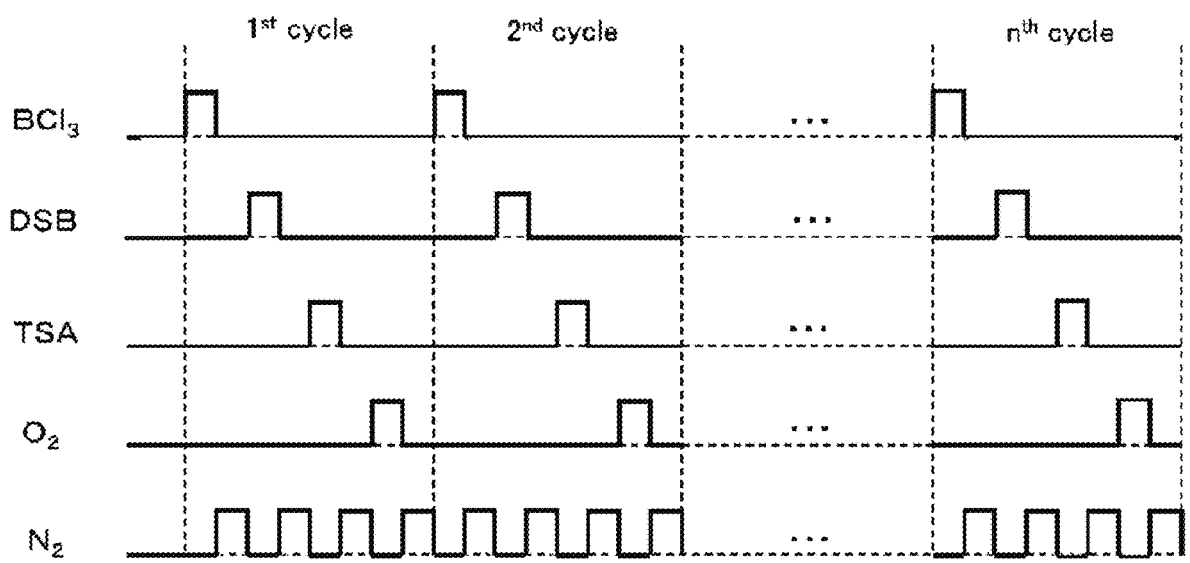
FIG. 5 is a diagram illustrating a gas supply sequence of a film-forming step according to embodiments of the present disclosure.

At the film-forming step (step A) described above, as illustrated in the gas supply sequence in FIG. 5, a film containing the Si—C bonds, the Si—N bonds, and B, i.e., a film containing Si, C, N, and B, is formed as the first film on the wafer 200 by performing a cycle a predetermined number of times, the cycle including non-simultaneously performing (a) a step of supplying a $BCl_3$ gas as the B-containing pseudo-catalyst gas to the wafer 200; (b) a step of supplying a DSB gas as the first precursor gas which contains the Si—C bonds and does not contain halogen to the wafer 200; and (c) a step of supplying a TSA gas as a second precursor gas which contains Si—N bonds and does not contain an alkyl group to the wafer 200 under a condition that at least a portion of the Si—C bonds in the DSB gas and at least a portion of the Si—N bonds in the TSA gas are held without being broken.

The aforementioned cycle further includes performing (d) a step of supplying an $O_2$ gas as an oxidizing agent to the wafer 200, non-simultaneously with each of (a), (b), and (c) described above. In this case, the first film formed on the wafer 200 further contains O and becomes a film containing the Si—C bonds, the Si—N bonds, O, and B, i.e., a film containing Si, O, C, N, and B, namely a silicon oxycarbonitride film (SiOCN film) containing B. Since B contained in this film is at an impurity level, this film will be simply referred to as a SiOCN film. This SiOCN film may contain Cl, H, or the like as an impurity, in addition to B.

Furthermore, at the hygroscopic-site-eliminating step (step B) described above, a hygroscopic site that is formed due to B, Cl, Si—H bonds, or the like in the first film is eliminated by reacting with a $H_2O$ gas, without breaking each of the Si—C bonds and the Si—N bonds in the first film, by supplying the $H_2O$ gas as the gas containing H and O to the wafer 200.

In addition, the thermal annealing step (step C) described above has a step of performing a first thermal annealing process to the second film at a first temperature (first thermal annealing step), and a step of performing a second thermal annealing process to the second film at a second temperature different from the first temperature (second thermal annealing step). In the present embodiments, the first thermal annealing process described above is performed by a normal thermal annealing process, and the second thermal annealing process is performed by a RTA process (rapid thermal annealing process).

In the present disclosure, for the sake of convenience, the gas supply sequence illustrated in FIG. 5 may be denoted as follows. The same denotation will be used in other embodiments as described hereinbelow.

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

(Wafer Charging and Boat Loading)

The plurality of wafers 200 is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 through the O-ring 220.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired film-forming temperature. In this operation, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The operation of the vacuum pump 246 and the heating and rotation of the wafers 200 may be all continuously performed at least until the process to the wafers 200 is completed.

(Film-Forming Step)

Next, the following steps 1 to 4 are sequentially performed.

[Step 1]

At this step, a $BCl_3$ gas is supplied to the wafer 200 accommodated within the process chamber 201. Specifically, the valve 243b is opened to allow a $BCl_3$ gas to flow through the gas supply pipe 232b. The flow rate of the $BCl_3$ gas is adjusted by the MFC 241b. The $BCl_3$ gas is supplied into the process chamber 201 via the nozzle 249b and is exhausted from the exhaust pipe 231. At this time, the $BCl_3$ gas is supplied to the wafer 200. Simultaneously, the valves 243c and 243d are opened to allow an $N_2$ gas to flow through the gas supply pipes 232c and 232d.

An example of the processing conditions at this step may be described as follows:

Supply flow rate of $BCl_3$ gas: 1 to 2,000 sccm
Supply flow rate of $N_2$ gas (for each gas supply pipe): 0 to 10,000 sccm
Supply time of each gas: 1 to 120 seconds
Processing temperature (film-forming temperature): 380 to 500 degrees C., or 400 to 450 degrees C. in some embodiments
Processing pressure (film-forming pressure): 1 to 2,000 Pa.

Furthermore, in the present disclosure, the expression of the numerical range such as "380 to 500 degrees C." may mean that a lower limit value and an upper limit value are included in that range. Therefore, for example, "380 to 500 degrees C." may mean "380 degrees C. or higher and 500 degrees C. or lower". The same applies to other numerical ranges.

By supplying the $BCl_3$ gas to the wafer 200 under the aforementioned conditions, it is possible to adsorb $BCl_3$ onto the outermost surface of the wafer 200 while suppressing the decomposition of the $BCl_3$ gas in the gas phase in the process chamber 201 (gas phase decomposition), i.e., the thermal decomposition. Thus, a layer containing B and Cl can be formed on the wafer 200 as a first layer (initial layer). The first layer becomes a layer containing $BCl_3$ physically adsorbed onto the wafer 200 or a substance generated by chemically adsorbing $BCl_3$ onto the wafer 200. These substances adsorbed onto the surface of the wafer 200 act as pseudo-catalysts that cause a film-forming reaction (a formation reaction of a second layer and a third layer which will be described below) to go ahead on the surface of the wafer 200 at steps 2 and 3 which will be described below. Hereinafter, these substances acting as the pseudo-catalysts will also be referred to as $BCl_x$ (where x is 1 to 3) for the sake of convenience. The first layer that acts as the pseudo-catalyst will also be referred to as a pseudo-catalyst layer.

After the first layer is formed on the wafer 200, the valve 243b is closed to stop the supply of the $BCl_3$ gas into the process chamber 201. Then, the interior of the process chamber 201 is vacuum-exhausted and the gas or the like, which remains within the process chamber 201, is removed from the interior of the process chamber 201. At this time, the valves 243c and 243d are opened to supple an $N_2$ gas into the process chamber 201. The $N_2$ gas acts as a purge gas. Accordingly, it is possible to remove the $BCl_3$ gas floating in the process chamber 201. Thus, it is possible to perform step 2, as described hereinbelow, in a state where the $BCl_3$ gas is not floating in the process chamber 201 (non-floating state).

As the B-containing pseudo-catalyst gas, it may be possible to use, in addition to the $BCl_3$ gas, a monochloroborane ($BClH_2$) gas, a dichloroborane ($BCl_2H$) gas, a trifluoroborane ($BF_3$) gas, a tribromoborane ($BBr_3$) gas, diborane ($B_2H_6$) gas, or the like.

As the inert gas, it may be possible to use, in addition to the $N_2$ gas, a rare gas such as an Ar gas, a He gas, a Ne gas, a Xe gas or the like. This also applies to steps 2 to 4, steps B and C, and the like as described hereinbelow.

[Step 2]

At this step, a DSB gas is supplied to the wafer 200 in the process chamber 201, i.e., the first layer formed on the wafer 200, in a state where the $BCl_3$ gas is not floating in the process chamber 201. Specifically, the opening/closing control of the valves 243a, 243c, and 243d is performed in the same procedure as the opening/closing control of the valves 243b to 243d at step 1. The flow rate of the DSB gas is controlled by the MFC 241a. The DSB gas is supplied into the process chamber 201 via the nozzle 249a and is exhausted from the exhaust pipe 231. At this time, the DSB gas is supplied to the wafer 200.

An example of the processing conditions at this step may be described as follows:

Supply flow rate of DSB gas: 1 to 2,000 sccm
Supple time of DSB gas: 1 to 300 seconds
Processing pressure: 1 to 4,000 Pa.

Other processing conditions may be similar to the processing conditions of step 1.

By supplying the DSB gas to the wafer 200 under the aforementioned conditions, a pseudo-catalytic reaction occurs by the pseudo-catalytic action of $BCl_x$ contained in the first layer. Thus, a portion of the molecular structure of DSB can be decomposed. Then, a substance generated by decomposing a portion of the molecular structure of DSB, for example, a first intermediate containing a Si—C bond or the like, can be adsorbed (chemically adsorbed) onto the surface of the wafer 200. Thus, the first layer can be modified to form a silicon carbide layer (SiC layer) which is a layer containing Si and C as the second layer on the wafer 200. In addition, since the DSB gas is terminated by a Si—H bond and a C—H bond, it has a property that is difficult to be adsorbed onto the surface of the wafer 200, but it is efficiently adsorbed onto the surface of the wafer 200 through the use of the pseudo-catalytic action of $BCl_x$. As described above, the formation reaction of the second layer goes ahead by the pseudo-catalytic action of $BCl_x$ previously adsorbed onto the surface of the wafer 200, and is mainly based on a surface reaction rather than a gas phase reaction. At this time, since $BCl_3$ is not floating in the process chamber 201, the formation reaction of the second layer can more reliably go ahead by the surface reaction rather than the gas phase reaction.

Furthermore, at least a portion of Si—C bonds of the DSB gas are held without being broken under the aforementioned conditions. Therefore, the second layer becomes a layer containing Si and C in the form of Si—C bonds. In addition, a portion of $BCl_x$ contained in the first layer may be left in the second layer without being eliminated under the aforementioned conditions. Thus, the second layer becomes a layer containing $BCl_x$ as well. $BCl_x$ contained in the second layer acts as a pseudo-catalyst that causes a film-forming reaction (formation reaction of the third layer) to go ahead at step 3 as described hereinbelow. The second layer may also be referred to as a SiC layer containing $BCl_x$.

After the second layer is formed on the wafer 200, the valve 243a is closed to stop the supply of the DSB gas into the process chamber 201. Then, the gas or the like, which remains within the process chamber 201, is removed from the interior of the process chamber 201 according to the same processing procedures as those of step 1.

Figure 6A:
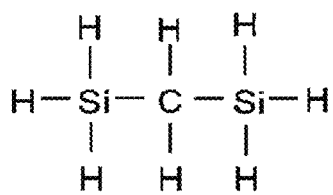
FIG. 6A illustrates a chemical structural formula of 1,3-disilapropane.
Figure 6B:
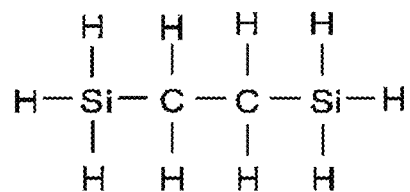
FIG. 6B is a chemical structural formula of 1,4-disilabutane.
Figure 6C:
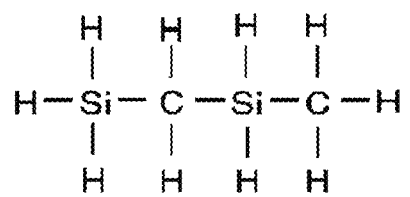
FIG. 6C illustrates a chemical structural formula of 1,3-disilabutane.
Figure 6D:
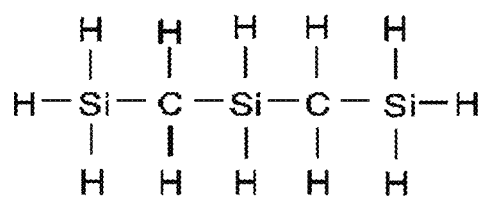
FIG. 6D illustrates a chemical structural formula of 1,3,5-trisilapentane.
Figure 6E:
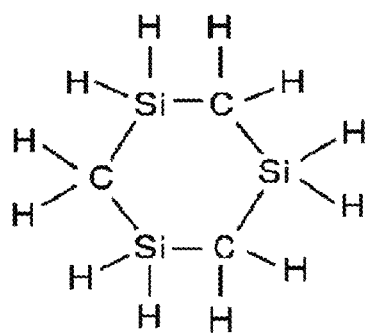
FIG. 6E illustrates a chemical structural formula of 1,3,5-trisilacyclohexane.
Figure 6F:
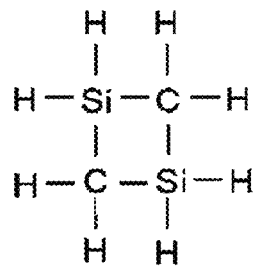
FIG. 6F illustrates a chemical structural formula of 1,3-disilacyclobutane.

As the first precursor, it may be possible to use, in addition to the DSB gas, a 1,3-disilapropane ($SiH_3CH_2SiH_3$, abbreviation: 1,3-DSP) gas, a 1,3-disilabutane ($SiH_3CH_2SiH_2CH_3$, abbreviation: 1,3-DSB) gas, a 1,3,5-trisilapentane ($SiH_3CH_2SiH_2CH_2SiH_3$, abbreviation: 1,3,5-TSP) gas, a 1,3,5-trisilacyclohexane ($SiH_2CH_2SiH_2CH_2SiH_2CH_2$, abbreviation: 1,3,5-TSCH) gas, a 1,3-disilacyclobutane ($SiH_2CH_2SiH_2CH_2$, abbreviation: 1,3-DSCB) gas, or the like. FIG. 6A illustrates a chemical structure formula of 1,3-DSP, FIG. 6C illustrates a chemical structure formula of 1,3-DSB, FIG. 6D illustrates a chemical structure formula of 1,3,5-TSP, FIG. 6E illustrates a chemical structural formula of 1,3,5-TSCH, and FIG. 6F illustrates a chemical structural formula of 1,3-DSCB. These gases are substances which contain Si—C bonds and do not contain halogen. The substances illustrated in FIGS. 6A to 6F contain little or no following bonds, which may cause a reduction in processing resistance of a SiOCN film formed on the wafer 200, for example, a bond between C atoms in which C is bonded to two or more bonding hands, three or more bonding hands in some embodiments, or all (four) bonding hands in some embodiments (hereinafter, this bond will be simply referred to as a C—C bond), a chemical bond of C and O (C—O bond), a chemical bond of Si and an alkyl group (R) (Si—R bond), a chemical bond of N and H (N—H bond), and a chemical bond of N and O (N—O bond). The term "processing resistance" is a general term of wet etching resistance, dry etching resistance, and ashing resistance (wet etching resistance after an ashing process).

[Step 3]

At this step, a TSA gas is supplied to the wafer 200 in the process chamber 201, i.e., the second layer formed on the wafer 200. Specifically, the opening/closing control of the valves 243a, 243c, and 243d is performed in the same procedure as the opening/closing control of the valves 243b to 243d at step 1. The flow rate of the TSA gas is controlled by the MFC 241a. The TSA gas is supplied into the process chamber 201 via the nozzle 249a and is exhausted from the exhaust pipe 231. At this time, the TSA gas is supplied to the wafer 200.

An example of the processing conditions at this step may be described as follows:

Supply flow rate of TSA gas: 1 to 2,000 sccm
Supply time of TSA gas: 1 to 300 seconds
Processing pressure: 1 to 2,000 Pa.

Other processing conditions may be similar to the processing conditions of step 1.

By supplying the TSA gas to the wafer 200 under the aforementioned conditions, a pseudo-catalytic reaction occurs by the pseudo-catalytic action of $BCl_x$ contained in the second layer. Thus, a portion of the molecular structure of TSA can be decomposed. Then, a substance generated by decomposing a portion of the molecular structure of TSA, for example, a second intermediate containing a Si—N bond or the like can be adsorbed (chemically adsorbed) onto the surface of the wafer 200. Thus, the second layer can be modified to form a silicon carbonitride layer (SiCN layer) which is a layer containing Si, C, and N as the third layer on the wafer 200. In addition, since the TSA gas is terminated by a Si—H bond, it has a property that is difficult to be adsorbed onto the surface of the wafer 200, but it is efficiently adsorbed onto the surface of the wafer 200 through the use of the pseudo-catalytic action of $BCl_x$. As described above, the formation reaction of the third layer goes ahead by the pseudo-catalytic action of $BCl_x$ remaining in the second layer, and is mainly based on the surface reaction rather than the gas phase reaction.

Furthermore, at least a portion of Si—N bonds of the TSA gas are held without being broken under the aforementioned conditions. Therefore, the third layer becomes a layer containing Si and N in the form of Si—N bonds. In addition, at least a portion of Si—C bonds contained in the second layer are held without being broken under the aforementioned conditions. Therefore, the third layer becomes a layer containing Si and C in the form of Si—C bonds. Furthermore, most of $BCl_x$ contained in the second layer is consumed during the reaction with the TSA gas, under the aforementioned conditions, and is removed from the second layer. The amount of $BCl_x$ contained in the third layer is reduced to an impurity level. Since the third layer contains an impurity level of B, the third layer may also be referred to as a SiCN layer containing B. The third layer may contain Cl, H, or the like as an impurity, in addition to B.

After the third layer is formed on the wafer 200, the valve 243a is closed to stop the supply of the TSA gas into the process chamber 201. Then, the gas or the like, which remains within the process chamber 201, is removed from the interior of the process chamber 201 according to the same processing procedures as those of step 1.

As the second precursor, it may be possible to use, in addition to the TSA gas, a monochlorosilylamine ($N(SiH_3)_2SiH_2Cl$) gas, or the like. FIG. 6B illustrates a chemical structural formula of monochlorosilylamine. Monochlorosilylamine is a substance which contains three Si—N bonds in one molecule and does not contain an alkyl group. As illustrated in FIGS. 6A and 6B, these substances contain little or no aforementioned bonds, which may cause a reduction in the processing resistance of the SiOCN film formed on the wafer 200, for example, the C—C bond, the C—O bond, the Si—R (where R is an alkyl group) bond, the N—H bond, or the N—O bond.

[Step 4]

At this step, an $O_2$ gas is supplied to the wafer 200 in the process chamber 201, i.e., the third layer formed on the wafer 200. Specifically, the opening/closing control of the valves 243b to 243d is performed in the same procedure as the opening/closing control of the valves 243b to 243d at step 1. The flow rate of the $O_2$ gas is controlled by the MFC 241b. The $O_2$ gas is supplied into the process chamber 201 via the nozzle 249b and is exhausted from the exhaust pipe 231. At this time, the $O_2$ gas is supplied to the wafer 200.

An example of the processing conditions at this step may be described as follows:

Supply flow rate of $O_2$ gas: 1 to 10,000 sccm
Supply time of $O_2$ gas: 1 to 300 seconds
Processing pressure: 1 to 4,000 Pa.

Other processing conditions may be similar to the processing conditions of step 1.

By supplying the $O_2$ gas to the wafer 200 under the aforementioned conditions, at least a portion of the third layer formed on the wafer 200 can be modified (oxidized). Thus, an impurity such as B, Cl, H or the like can be desorbed from the third layer, and the O component contained in the $O_2$ gas can be introduced into the third layer. By oxidizing the third layer, a silicon oxycarbonitride layer (SiOCN layer), which is a layer containing Si, O, C, and N, can be formed as a fourth layer on the wafer 200.

Furthermore, at least a portion of each of Si—C bonds and Si—N bonds contained in the third layer are held without being broken under the aforementioned conditions. Therefore, the fourth layer becomes a layer containing each of the Si—C bonds and the Si—N bonds. In addition, when oxidizing the third layer, an impurity such as B or the like contained in the third layer may remain under the aforementioned conditions, and thus the fourth layer may contain the impurity such as B or the like. Therefore, the fourth layer may also be referred to as an SiOCN layer containing B. The fourth layer may contain Cl, H, or the like as an impurity, in addition to B.

After the fourth layer is formed on the wafer 200, the valve 243b is closed to stop the supply of the $O_2$ gas into the process chamber 201. Then, the gas or the like, which remains within the process chamber 201, is removed from the interior of the process chamber 201 according to the same processing procedures as those of step 1.

As the oxidizing agent, it may be possible to use, in addition to the $O_2$ gas, a nitrous oxide ($N_2O$) gas, a nitrogen monoxide (NO) gas, a nitrogen dioxide ($NO_2$) gas, a carbon monoxide (CO) gas, a carbon dioxide ($CO_2$) gas, an ozone ($O_3$) gas, a hydrogen peroxide ($H_2O_2$) gas, water vapor ($H_2O$ gas), an $O_2$ gas+hydrogen ($H_2$) gas, or the like.

[Performing a Predetermined Number of Times]

A cycle which non-simultaneously, i.e., non-synchronously, performs steps 1 to 4 described above is implemented a predetermined number of times (n times, where n is an integer of 1 or more). Thus, a SiOCN film having a predetermined thickness and a predetermined composition can be formed as a first film on the wafer 200. The SiOCN film as the first film contains each of Si—C bonds and Si—N bonds, and may further contain an impurity level of B, Cl, H, or the like. The aforementioned cycle may be repeated multiple times. That is, the thickness of a fourth layer formed when the aforementioned cycle is performed once may be set smaller than a desired thickness and the aforementioned cycle may be repeated multiple times until the thickness of the SiOCN film formed by laminating the fourth layer becomes equal to the desired thickness.

Furthermore, the processing conditions illustrated at the film-forming step are conditions under which at least a portion of the Si—C bonds of the DSB gas are held without being broken when the DSB gas exists alone within the process chamber 201 at step 2. In addition, the aforementioned processing conditions are also conditions under which at least a portion of the Si—N bonds of the TSA gas are held without being broken when the TSA gas exists alone within the process chamber 201 at step 3. By performing the film-forming step under such conditions, each of the Si—C bonds and the Si—N bonds contained in each of the DSB gas and the TSA gas in the SiOCN film formed on the wafer 200 can be introduced as it is.

Furthermore, the processing conditions illustrated at the film-forming step are also conditions under which the $BCl_3$ gas is not pyrolyzed (gas phase decomposed) but is adsorbed onto the surface of the wafer 200 in the form of $BCl_x$ when the $BCl_3$ gas exists alone within the process chamber 201 at step 1. By performing the film-forming step under such conditions, it is possible to contain $BCl_x$ acting as a pseudo-catalyst in the first layer formed on the wafer 200. In addition, it is possible to improve in-plane uniformity of the thickness of the first layer formed on the wafer 200 (hereinafter, also simply referred to as an in-plane uniformity), and to improve the step coverage (hereinafter, also referred to as step coverage characteristics). As a result, the formation reaction of the second layer and the third layer can go ahead efficiently and at a uniform rate over the entire surface of the wafer 200. Furthermore, it is possible to enhance the deposition rate of the SiOCN film formed on the wafer 200, and to allow this film to become a film with high in-plane film thickness uniformity and excellent step coverage characteristics.

Moreover, if the processing temperature is lower than 380 degrees C., $BCl_3$ is difficult to be chemically adsorbed onto the surface of the wafer 200 at step 1, and the formation of the first layer on the wafer 200 may be difficult. Furthermore, at steps 2 and 3, the pseudo-catalytic action of $BCl_x$ is difficult to occur and the formation of the second layer and the third layer on the wafer 200 may be difficult. As a result, the formation of the SiOCN film on the wafer 200 may be difficult to go ahead at a practical deposition rate. By setting the processing temperature at 380 degrees C. or higher, these problems can be solved, and the formation of the SiOCN film on the wafer 200 can go ahead at a practical deposition rate. By setting the processing temperature at 400 degrees C. or higher, it is possible to further enhance the deposition rate of the SiOCN film formed on the wafer 200.

If the processing temperature exceeds 500 degrees C., the pyrolysis of the precursor excessively goes ahead at steps 2 and 3, and the formation of the second layer and the third layer may be difficult to go ahead in a situation where it is mainly based on the surface reaction rather than the gas phase reaction. Furthermore, at steps 2 and 3, there may be a case where at least a portion of the Si—C bonds of the DSB gas or at least a portion of the Si—N bonds of the TSA gas are difficult to be held. By setting the processing temperature at 500 degrees C. or lower, these problems can be solved. As a result, it is possible to improve the in-plane film thickness uniformity and step coverage characteristics of the SiOCN film formed on the wafer 200. In addition, it is easy to introduce the Si—C bonds and Si—N bonds into the SiOCN film formed on the wafer 200. By setting the processing temperature at 450 degrees C. or lower, these problems can be more effectively solved.

Therefore, it is desirable that the processing temperature at the film-forming step be set at a temperature which falls within a range of, e.g., 380 to 500 degrees C., or a temperature which falls within a range of 400 to 450 degrees C. in some embodiments.

Furthermore, as described above, B contained in the $BCl_3$ gas remains in the first film formed at the film-forming step. In addition, Cl contained in the $BCl_3$ gas and the Si—H bonds contained in the DSB gas or the TSA gas may remain in the first film. The B, Cl, Si—H bonds, or the like remaining in the first film may become a factor constituting a hygroscopic site in the film. The term "hygroscopic site" used herein may refer to a site that absorbs or adsorbs moisture, and may also be referred to as an absorption site or an adsorption site. FIGS. 8A, 9A, and 10A each illustrate schematic enlarged cross sectional views of the first film containing hygroscopic sites immediately after film formation (as-deposited). The hygroscopic sites existing in the film react with moisture in the atmosphere when the film is exposed to the atmosphere to become a factor that increases the dielectric constant of the film by introducing moisture into the film. Therefore, in the present embodiments, a hygroscopic-site-eliminating step and a thermal annealing step are sequentially performed on the first film formed on the wafer 200.

(Hygroscopic-Site-Eliminating Step)

In a state in which the wafer 200 having the first film formed on a surface of the wafer 200 is accommodated in the process chamber 201, the interior of the process chamber 201 is vacuum-exhausted (depressurization-exhausted) by the vacuum pump 246 so as to reach a desired pressure (modifying pressure). Furthermore, the wafer 200 in the process chamber 201 is heated by the heater 207 to a predetermined processing temperature (modifying temperature). Then, a $H_2O$ gas is supplied to the wafer 200 in the process chamber 201, i.e., the first film formed on the wafer 200. Specifically, the opening/closing control of the valves 243b to 243d is performed in the same procedure as the opening/closing control of the valves 243b to 243d at step 1. The flow rate of the $H_2O$ gas is controlled by the MFC 241b. The $H_2O$ gas is supplied into the process chamber 201 via the nozzle 249b and is exhausted from the exhaust pipe 231. At this time, the $H_2O$ gas is supplied to the wafer 200.

An example of the processing conditions at this step may be described as follows:

Processing temperature (modifying temperature): 200 to 700 degrees C., or 250 to 600 degrees C. in some embodiments Processing pressure (modifying pressure): 1 to 101,325 Pa, or 53,329 to 101,325 Pa in some embodiments Supply flow rate of $H_2O$ gas: 1 to 10,000 sccm, or 10 to 2,000 sccm in some embodiments Supply time of $H_2O$ gas: 10 to 360 minutes, or 60 to 360 minutes in some embodiments.

Other processing conditions may be similar to the processing conditions of step 1.

By supplying the $H_2O$ gas to the wafer 200 under the aforementioned conditions, the hygroscopic sites that are formed due to B in the first film can be eliminated by reacting with the $H_2O$ gas. Furthermore, the hygroscopic sites that are formed due to Cl in the first film can be eliminated by reacting with $H_2O$ gas. In addition, the hygroscopic sites that formed due to the Si—H bonds in the first film can be eliminated by reacting with the $H_2O$ gas. All or most of the hygroscopic sites in the first film are eliminated by reacting with $H_2O$ supplied to the wafer 200. The first film is modified into the second film, which contains no or little hygroscopic site and contains $H_2O$ that has reacted with the hygroscopic sites or $H_2O$ that has not contributed to the reaction with the hygroscopic sites. That is, the second film contains no (little) hygroscopic site, but contains $H_2O$ reacted with the hygroscopic sites, chemically adsorbed $H_2O$, or physically adsorbed $H_2O$. Furthermore, the molecular structure of $H_2O$ reacted with the hygroscopic sites or chemically adsorbed $H_2O$ is changed by the reaction or chemical adsorption. In the present disclosure, for the sake of convenience, $H_2O$ whose molecular structure is changed by the reaction with the hygroscopic sites or chemical adsorption may also be referred to as $H_2O$. FIG. 8B illustrate a schematic enlarged cross sectional view of the first film after the hygroscopic-site-eliminating process is performed, i.e., the second film. By performing this step under the aforementioned conditions, it is possible to eliminate the hygroscopic sites from the first film without breaking each of the Si—C bonds and the Si—N bonds in the first film.

For reference, FIG. 9B illustrates a schematic enlarged cross sectional view of a film after the as-deposited first film is exposed to the atmosphere for a short time, and FIG. 10B illustrates a schematic enlarged cross sectional view of a film after the as-deposited first film is exposed to the atmosphere for a long time. As illustrated in these drawings, when the as-deposited first film is exposed to the atmosphere, the hygroscopic sites existing in the first film react with $H_2O$ in the atmosphere to introduce $H_2O$ into the film (the film absorbs moisture). A portion of the hygroscopic sites existing in the first film are eliminated by reacting with $H_2O$ in the atmosphere. However, unlike the case where the hygroscopic-site-eliminating process is performed as in the present embodiments, all or most of the hygroscopic sites existing in the film are difficult to be eliminated simply by exposing the as-deposited first film to the atmosphere. As illustrated in FIGS. 9B and 10B, most or a portion of the hygroscopic sites remain in the film in which the as-deposited first film is simply exposed to the atmosphere without performing the hygroscopic-site-eliminating process, without being eliminated.

Furthermore, at this step, it is possible to desorb at least a portion of byproducts generated by the reaction between the hygroscopic sites and the $H_2O$ gas from the film.

For example, the hygroscopic sites that are formed due to Cl in the first film react with the $H_2O$ gas to generate byproducts containing Cl, such as HCl or the like, and the byproducts containing Cl can be desorbed from the film. In addition, for example, the hygroscopic sites that are formed due to B or Si—H in the first film reacts with the $H_2O$ gas to generate byproducts containing H, O, B or the like, such as $H_2$ or $H_2O$, and at least a portion of them can be desorbed from the film. By performing this step, all or most of byproducts containing Cl such as HCl or the like can be desorbed from the film. There is a tendency that the byproducts containing H, O, B or the like are not desorbed from the first film and a portion of them remain in the film even when this step is performed. However, by performing the thermal annealing step as described hereinbelow, it is possible to desorb the byproducts containing H, O, B or the like remaining in the first film from the film. By setting the processing temperature (modifying temperature) at this step at a processing temperature equal to or higher than the processing temperature (film-forming temperature) at the film-forming step, it is possible to promote the desorption of byproducts from the film described above.

Furthermore, if the modifying temperature is lower than 200 degrees C., the hygroscopic sites that are formed due to B or the like in the first film may be difficult to be eliminated by reacting with the $H_2O$ gas. By setting the modifying temperature at 200 degrees C. or higher, it is possible to eliminate the hygroscopic sites that are formed due to an impurity such as B or the like in the first film by reacting with the $H_2O$ gas. By setting the modifying temperature at 250 degrees C. or higher, it is possible to promote the elimination of the hygroscopic sites by the reaction between the adsorption sites that are formed due to an impurity such as B or the like in the first film and the $H_2O$ gas.

In addition, if the modifying temperature exceeds 700 degrees C., the oxidizing power of the $H_2O$ gas becomes excessive, making the influence of oxidation of underlayer of the first film large. Furthermore, the Si—C bonds or Si—N bonds in the first film are broken and C or N in the first film is substituted by O, causing deterioration of the processing resistance. By setting the modifying temperature at 700 degrees C. or lower, these problems can be solved. By setting the modifying temperature at 600 degrees C. or lower, these problems can be more effectively solved.

As the gas containing H and O, it may be possible to use, in addition to the $H_2O$ gas, a gas containing a OH group such as a $H_2O_2$ gas or the like.

After the hygroscopic sites in the first film are eliminated, the valve 243b is closed to stop the supply of the $H_2O$ gas into the process chamber 201. Then, the gas or the like, which remains within the process chamber 201, is removed from the interior of the process chamber 201 according to the same processing procedures as those of step 1.

(After-Purge and Atmospheric Pressure Return)

After the hygroscopic-site-eliminating step is completed, the $N_2$ gas is supplied from each of the gas supply pipes 232c and 232d into the process chamber 201 and is exhausted from the exhaust pipe 231. Thus, the interior of the process chamber 201 is purged and the gas or the byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

Thereafter, the seal cap 219 is moved down by the boat elevator 115 to open the lower end of the reaction tube 203. Then, the processed wafers 200 supported on the boat 217 are unloaded from the lower end of the reaction tube 203 to the outside of the reaction tube 203 (boat unloading). The wafers 200 on which the hygroscopic-site-eliminating step has been performed are discharged from the boat 217 (wafer discharging).

(Thermal Annealing Step)

After the hygroscopic-site-eliminating step is completed, the thermal annealing step is performed. At this step, the thermal annealing process is performed in multiple stages (in the present embodiments, two stages as an example) by changing the processing conditions. Specifically, a step of performing a first thermal annealing process to the second film at a first temperature (first thermal annealing step) and a step of performing a second thermal annealing process to the second film at a second temperature different from the first temperature (second thermal annealing step) are sequentially performed.

At the first thermal annealing step, the wafer 200 on which the hygroscopic-site-eliminating step has been performed is loaded into a second process chamber different from the first process chamber (process chamber 201) described above. Thereafter, the internal pressure of the second process chamber is adjusted to a predetermined processing pressure (first pressure), and the wafer 200 in the second process chamber is heated to a predetermined processing temperature (first temperature). Then, a state in which the internal pressure of the second process chamber is set at the first pressure and the temperature of the wafer 200 is set at the first temperature is maintained for a predetermined processing time (first thermal annealing process time). The annealing process at this step may be, for example, a thermal annealing process performed while heating the wafer 200 using a resistance heater, i.e., a so-called normal thermal annealing process. Furthermore, when performing this step, it is desirable that the inert gas such as the $N_2$ gas or the like be supplied into the second process chamber and the interior of the second process chamber be exhausted to make the interior of the second process chamber in an inert gas atmosphere.

An example of the processing conditions at the first thermal annealing step may be described as follows:

Processing temperature (first temperature): 550 to 850 degrees C., or 600 to 800 degrees C. in some embodiments Processing pressure (first pressure): 1 to 101,325 Pa Supply flow rate of $N_2$ gas: 1 to 5,000 sccm First thermal annealing process time: 1 to 240 minutes.

By performing the first thermal annealing step under the aforementioned conditions, it is possible to desorb moisture contained in the second film from the film as illustrated in FIG. 8C. At this time, by maintaining spaces from which the moisture is desorbed in the second film to become pores, it is possible to make the film porous. The second film is modified into a porous third film having a plurality of pores in the film. The film density of the third film is lower than the film density of each of the first film and the second film described above. Furthermore, in order to allow the action described above to go ahead efficiently and reliably, it is desirable that the first temperature be set at a temperature higher than the processing temperature (modifying temperature) at the hygroscopic-site-eliminating step described above. In addition, by performing this step under the aforementioned conditions, it is possible to make the film porous by desorbing the moisture contained in the second film from the film without breaking each of the Si—C bonds and Si—N bonds in the second film.

Furthermore, it is possible to make the film porous according to the processing conditions even at the hygroscopic-site-eliminating step. That is, when the hygroscopic-site-eliminating step is performed under a condition (temperature) in which the moisture is desorbed, it is possible to make the film porous by desorbing the moisture absorbed in the film from the film while eliminating the hygroscopic sites by reacting with the $H_2O$ gas. In this case, the film density of the second film formed by performing the hygroscopic-site-eliminating step is lower than the film density of the first film described above.

Even at this step, i.e., the first thermal annealing step, it is possible to desorb the byproducts generated by the reaction between the hygroscopic sites and the $H_2O$ gas from the film. That is, it is possible to desorb the byproducts containing H, O, B or the like remaining in the second film from the film. Furthermore, even when the byproducts containing Cl remain in the second film, it is possible to desorb the byproducts from the film. In addition, by setting the processing temperature (first temperature) at this step at a temperature higher than the processing temperature (modifying temperature) at the hygroscopic-site-eliminating step, it is possible to promote the desorption of the byproducts from the film described above.

After the first thermal annealing step is completed, the wafer 200 on which the first thermal annealing step has been performed is unloaded from the second process chamber.

Subsequently, the second thermal annealing step is performed. At this step, the wafer 200 on which the first thermal annealing step has been performed is loaded into a third process chamber different from both the first process chamber (process chamber 201) and the second process chamber. Thereafter, the internal pressure of the third process chamber is adjusted to a predetermined processing pressure (second pressure), and the wafer 200 in the third process chamber is heated to a predetermined processing temperature (second temperature). Then, a state in which the internal pressure of the third process chamber is set at the second pressure and the temperature of the wafer 200 is set at the second temperature is maintained for a predetermined processing time (second thermal annealing processing time) different from the aforementioned first thermal annealing process time. The annealing process at this step may be a thermal annealing process performed while heating the wafer 200, for example, using a lamp heater, i.e., a so-called rapid thermal annealing process (RTA process). Thus, it is possible to make the second thermal annealing process time shorter than the first thermal annealing process time described above, and to manage the thermal history of the wafer 200 well. Furthermore, when this step is performed, it is desirable that the inert gas such as the $N_2$ gas be supplied into the third process chamber and the interior of the third process chamber be exhausted to make the interior of the third process chamber in an inert gas atmosphere.

An example of the processing conditions at the second thermal annealing step may be described as follows:

Processing temperature (second temperature): 800 to 1,200 degrees C.

Processing pressure (second pressure): 1 to 101,325 Pa

Supply flow rate of $N_2$ gas: 1 to 5,000 sccm

Second thermal annealing process time: $1.0 \times 10^{-6}$ to 240 seconds.

By performing the second thermal annealing step under the aforementioned conditions, it is possible to reliably desorb the moisture contained in the third film, which could not completely be desorbed at the first thermal annealing step, from the film. Furthermore, at this time, it is possible to further form the aforementioned pores in the third film, to further make the film porous, and to increase the degree of porosity of the film. The film density of the third film formed by performing the second thermal annealing step will be lower than the film density of each of the first film and the second film described above. In addition, even if depending on the residual degree of moisture, which could not completely be desorbed at the first thermal annealing step, contained in the third film, it is also possible to make the film density of the third film formed by performing the second thermal annealing step lower than the film density of the third film formed by performing the first thermal annealing step. Furthermore, in order to efficiently and reliably exhibit the action described above, it is desirable that the second temperature be set higher than the first temperature described above. Moreover, by performing this step under the aforementioned conditions, it is possible to increase the degree of porosity of this film by reliably desorbing the moisture contained in the third film from the film without breaking each of the Si—C bonds and Si—N bonds in the third film.

Furthermore, even at this step, i.e., the second thermal annealing step, it is possible to desorb the byproducts generated by the reaction between the hygroscopic sites and the $H_2O$ gas from the film. That is, it is possible to desorb the byproducts containing H, O, B or the like remaining in the third film from the film. Furthermore, even when the byproducts containing Cl remain in the third film, it is possible to desorb the byproducts from the film. At the second thermal annealing step, the film can be cured, particularly, by desorbing H in the film and strengthening the bonding state between atoms constituting the film. Thus, when this film is exposed to the atmosphere, it is possible to reliably suppress the introduction (moisture absorption) of $H_2O$ into the film. Moreover, by setting the processing temperature (second temperature) at this step at a temperature higher than the processing temperature (modifying temperature) at the hygroscopic-site-eliminating step, and further, at a temperature higher than the processing temperature (first temperature) at the first thermal annealing step, it is possible to promote the desorption of byproducts from the film and the curing of the film described above.

After the thermal annealing step is completed, the processed wafers 200 are unloaded from the third process chamber, and the substrate-processing sequence in the present embodiments is completed. Furthermore, when the processed wafers 200 are unloaded from the third process chamber, the third film formed on the wafers 200 is exposed to the atmosphere. As described above, the third film is modified into a film which does not contain the hygroscopic sites in the forming process thereof, and as illustrated in FIG. 8D, the introduction (moisture absorption) of $H_2O$ into the third film is suppressed even when exposed to the atmosphere. Furthermore, in the present embodiments, in the case of the film after the hygroscopic-site-eliminating step is performed, the introduction (moisture absorption) of $H_2O$ into the film is suppressed even when exposed to the atmosphere.

(3) Effects According to the Present Embodiments

According to the present embodiments, one or more effects as set forth below may be achieved.

(a) By performing the hygroscopic-site-eliminating step and the thermal annealing step after performing the film-forming step, it is possible to allow the SiOCN film (third film) finally formed on the wafer 200 to become a film which is hard to absorb moisture even when exposed to the atmosphere because it does not contain the hygroscopic sites. This makes it possible to allow the SiOCN film finally formed on the wafer 200 to become a low dielectric constant film (low-k film), and to maintain the low dielectric constant film as it is.

Furthermore, as illustrated in FIGS. 9B and 10B, when a film on which the hygroscopic-site-eliminating process is not performed in the substrate processing is exposed to the atmosphere, a portion of the hygroscopic sites existing in the film are eliminated by reacting with $H_2O$, but most or a portion of the hygroscopic sites remain without being eliminated. Even when the moisture is desorbed from the film by performing the thermal annealing process to such a film that the hygroscopic sites remain in the film, as illustrated in FIGS. 9C and 10C, since the hygroscopic sites still remain in the film, the state in which it is easy to absorb moisture is maintained. In such a state, as illustrated in FIGS. 9D and 10D, when the film on which the thermal annealing process has been performed is again exposed to the atmosphere, the moisture will again be absorbed due to the hygroscopic sites remaining in the film. That is, unlike the present embodiments, when the hygroscopic-site-eliminating process is not performed in the substrate processing, the SiOCN film finally formed on the wafer 200 is difficult to become a low dielectric constant film and is also difficult to maintain such a low dielectric constant as it is even when the low dielectric constant film could be formed in an as-deposited state.

(b) By performing the hygroscopic-site-eliminating step and the thermal annealing step after performing the film-forming step, it is possible to allow the SiOCN film finally formed on the wafer 200 to become a film having a low impurity concentration such as B, Cl, H or the like. This makes it possible to remove the factor of the hygroscopic sites in the SiOCN film finally formed on the wafer 200, and to not only achieve the same effects as described above but also allow this film to become a film having excellent processing resistance.

(c) By performing the hygroscopic-site-eliminating step and the thermal annealing step after performing the film-forming step, it is possible to allow the SiOCN film finally formed on the wafer 200 to become a porous film containing the plurality of pores in the film, and to become a film having a low film density. This makes it possible to allow the SiOCN film finally formed on the wafer 200 to become a film having a lower dielectric constant. Furthermore, as described above, according to the processing conditions of the hygroscopic-site-eliminating step, it is possible to make the film porous at the hygroscopic-site-eliminating step, and to lower the film density.

(d) By using the DSB gas and the TSA gas under a condition in which at least a portion of the Si—C bonds in the DSB gas and at least a portion of the Si—N bonds in the TSA gas are held without being broken at the film-forming step, it is possible to introduce each of the Si—C bonds and the Si—N bonds in the DSB gas and the TSA gas into the SiOCN film formed on the wafer 200 as it is. Furthermore, by performing the hygroscopic-site-eliminating step and the thermal annealing step under a condition in which each of the Si—C bonds and the Si—N bonds in the SiOCN film is held without being broken, it is possible to maintain each of the Si—C bonds and the Si—N bonds contained in the DSB gas and the TSA gas in the SiOCN film finally formed on the wafer 200 as it is. This makes it possible to allow the SiOCN film finally formed on the wafer 200 to become a film having excellent processing resistance.

(e) By performing the film-forming step in a non-plasma atmosphere, it is easy to introduce each of the Si—C bonds and the Si—N bonds into the SiOCN film finally formed on the wafer 200. Furthermore, by performing the hygroscopic-site-eliminating step and the thermal annealing step in a non-plasma atmosphere, it is easy to maintain each of the Si—C bonds and the Si—N bonds introduced into the SiOCN film without being broken. Moreover, it is also possible to avoid plasma damage to the SiOCN film finally formed on the wafer 200. This makes it possible to allow the SiOCN film finally formed on the wafer 200 to become a film having excellent processing resistance.

(f) By using a substance which contains little or no C—C bond, C—O bond, Si—R (where R is an alkyl group) bond, N—H bond or the like that may cause a reduction in the processing resistance of the film as the first precursor gas and the second precursor gas, it is easy to prevent these various bonds from being contained in the SiOCN film finally formed on the wafer 200. This makes it possible to allow the SiOCN film finally formed on the wafer 200 to become a film having excellent processing resistance.

(g) According to various effects described above, in the present embodiments, even when the addition amount of the C component or N component to the SiOCN film finally formed on the wafer 200 is reduced, it is possible to sufficiently enhance the processing resistance of the film. Therefore, by reducing the addition amount of the C component or N component, which may cause an increase of the dielectric constant, to the SiOCN film, it is possible to allow this film to become a film having low dielectric constant while having excellent processing resistance. That is, according to the present embodiments, it is possible to achieve both improvement in processing resistance and reduction of dielectric constant which may be a trade-off relationship.

(h) By performing step 1 in which, before performing step 2, i.e., at the beginning of each cycle, $BCl_x$ is adsorbed onto the surface of the wafer 200, at the film-forming step, it is possible for the formation of the second layer at step 2 to efficiently go ahead by using the pseudo-catalytic action of $BCl_x$. Furthermore, by leaving a portion of $BCl_x$ contained in the first layer in the second layer when performing step 2, it is possible for the formation of the third layer at step 3 to efficiently go ahead by using the pseudo-catalytic action of $BCl_x$. As a result, it is possible for the formation of the SiOCN film on the wafer 200 to efficiently go ahead at a high deposition rate under the aforementioned low-temperature conditions and in a non-plasma atmosphere. Moreover, by performing step 1 before step 2 and not performing step 1 after step 2 but before step 3, it is easy to promote the introduction of Si—C bonds into the SiOCN film formed on wafer 200 more than the introduction of Si—N bonds.

(i) By using the pseudo-catalytic action of $BCl_x$ adsorbed onto the surface of the wafer 200 when performing step 2, it is possible to enhance the in-plane uniformity and step coverage characteristics of the second layer by allowing the formation of the second layer to go ahead by the surface reaction. Furthermore, by using the pseudo-catalytic action of $BCl_x$ remaining in the second layer when performing step 3, it is possible to enhance the in-plane uniformity and step coverage characteristics of the third layer by allowing the formation of the third layer to go ahead by the surface reaction. As a result, it is possible to enhance each of the in-plane film thickness uniformity and the step coverage characteristics of the SiOCN film formed on the wafer 200.

(j) By non-simultaneously performing steps 1 to 4, i.e., by sequentially supplying the $BCl_3$ gas, the DSB gas, the TSA gas, and the $O_2$ gas to the wafer 200 with the purge process in the process chamber 201 interposed therebetween, it is possible for the formation of the SiOCN film on the wafer 200 to go ahead by the surface reaction rather than by the gas phase reaction. Moreover, by performing a step of removing the $BCl_3$ gas floating in the process chamber 201 after performing step 1 and before performing step 2, i.e., by performing step 2 in a state in which the $BCl_3$ 3 gas is not floating in the process chamber 201, it is possible for the formation of the SiOCN film on the wafer 200 to more reliably go ahead by the surface reaction rather than by the gas phase reaction. As a result, it is possible to further enhance each of the in-plane film thickness uniformity and the step coverage characteristics of the SiOCN film formed on the wafer 200.

(k) By using a DSB gas which does not act as a N source but acts as a C source as the first precursor gas and using a TSA gas which does not act as a C source but acts as a N source as the second precursor gas, it is possible to independently control the amount of the C component and the amount of the N component to be introduced into the SiOCN film formed on the wafer 200. That is, it is possible to improve the controllability of the composition of the SiOCN film formed on the wafer 200, and to widely and precisely control the composition.

(l) The effects mentioned above can be similarly achieved in the case where the aforementioned B-containing pseudo-catalyst gas other than the $BCl_3$ gas is used, or in the case where the aforementioned first precursor gas other than the DSB gas is used, or in the case where the aforementioned second precursor gas other than the TSA gas is used, or in the case where the aforementioned oxidizing agent other than the $O_2$ gas is used, or in the case where the aforementioned inert gas other than the $N_2$ gas is used. Moreover, the same effects can be similarly achieved in the case where a gas having a OH group other than the $H_2O$ gas is used as the modifying gas.

(4) Modification Examples

The substrate-processing sequence of the present embodiments is not limited to the one illustrated in FIG. 4 but may be modified as in the modification examples described below. Furthermore, these modification examples may be arbitrarily combined. Unless otherwise specified, the processing procedures and processing conditions at each step of each of the modification examples may be similar to the processing procedures and processing conditions at each step of the substrate-processing sequence described above.

(Modification Example 1)

At the thermal annealing step, only the first thermal annealing step may be performed, or only the second thermal annealing step may be performed. Even in this modification example, the same effects as those of the embodiments described above with reference to FIG. 4 may be acquired. However, the aforementioned effects may be more reliably achieved by performing both the first thermal annealing step and the second thermal annealing step. For example, by performing both the first thermal annealing step and the second thermal annealing step, the effects when performing only the first thermal annealing step and the effects when performing only the second thermal annealing step may be complementarily achieved.

(Modification Example 2)

The thermal annealing step may be performed in the order of the second thermal annealing step and the first thermal annealing step. Even in this modification example, the same effects as those of the embodiments described above with reference to FIG. 4 may be acquired. However, by performing it in the order of the first thermal annealing step and the second thermal annealing step, it is easier to desorb $H_2O$ or an impurity from the deep portion in the film, and to reliably achieve the aforementioned effects over the entire area of the film.

(Modification Example 3)

In the substrate-processing sequence illustrated in FIG. 4, there has been described an example in which the film-forming step and the hygroscopic-site-eliminating step are performed in the same process chamber 201 (in-situ), and these steps, the first thermal annealing step, and the second thermal annealing step are performed in different process chambers (ex-situ), but the film-forming step to the first thermal annealing step may be performed in the same process chamber 201 and the second thermal annealing step may be performed in a process chamber different from the process chamber 201. When the film-forming step to the first thermal annealing step are performed in the same process chamber 201, it is possible to shorten the total processing time and to improve the throughput. In this case, it is desirable that the hygroscopic-site-eliminating step and the first thermal annealing step be performed at or near the same processing temperature, and further, the film-forming step and the hygroscopic-site-eliminating step be performed at or near the same processing temperature. Also, the film-forming step to the second thermal annealing step may be performed in the same process chamber 201. When the film-forming step to the second thermal annealing step are performed in the same process chamber 201, it is possible to shorten the total processing time depending on the processing conditions. In this case, it is desirable that the first thermal annealing step and the second thermal annealing step be performed at a processing temperature as close as possible. Moreover, it is desirable that the hygroscopic-site-eliminating step and the first thermal annealing step be performed at or near the same processing temperature, and the film-forming step and the hygroscopic-site-eliminating step be performed at or near the same processing temperature. Even in these modification examples, the same effects as those of the embodiments described above with reference to FIG. 4 may be achieved. Also, the hygroscopic-site-eliminating step and the first thermal annealing step may be performed at the same processing temperature. In this case, the processing temperature (the modifying temperature and the first temperature) may be set at, e.g., 550 to 700 degrees C. Also, the film-forming step and the hygroscopic-site-eliminating step may be performed at the same processing temperature. In this case, the processing temperature (the film-forming temperature and the modifying temperature) may be set at, e.g., 380 to 500 degrees C.

<Other Embodiments of the Present Disclosure>

While embodiments of the present disclosure have been specifically described above, the present disclosure is not limited to the aforementioned embodiments but may be differently modified without departing from the spirit of the present disclosure.

A film may be formed on the wafer 200 by the film-forming sequences illustrated below. Even in this modification example, the same effects as those of the embodiments described above with reference to FIGS. 4 and 5 may be acquired.

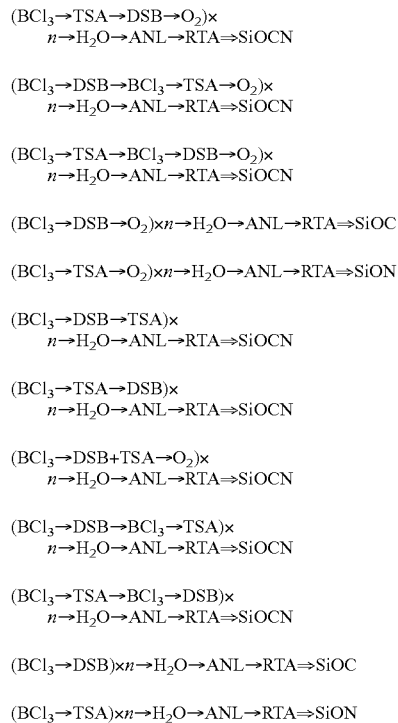

Recipes used in substrate processing may be prepared individually according to the processing contents and may be stored in the memory device 121c via a telecommunication line or the external memory device 123. Moreover, at the start of substrate processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there have been described examples in which films are formed using the substrate processing apparatus provided with a hot-wall-type process furnace. The present disclosure is not limited to the aforementioned embodiments but may be appropriately applied to a case where films are formed using a substrate processing apparatus provided with a cold-wall-type process furnace.

In the case of using these substrate processing apparatuses, the film-forming process may be performed by the sequences and processing conditions similar to those of the embodiments and modifications described above. Effects similar to those of the embodiments and modifications described above may be achieved.

The embodiments and modifications described above may be appropriately combined with one another. The processing procedures and processing conditions at this time may be similar to, for example, the processing procedures and processing conditions of the aforementioned embodiments.

[Embodiment Examples]

In sample 1, a SiOCN film was formed on a wafer using the substrate processing apparatus illustrated in FIG. 1 and by the substrate-processing sequence illustrated in FIG. 4. At the film-forming step, a film was formed by the film-forming sequence illustrated in FIG. 5. The processing conditions for producing sample 1 were set to predetermined conditions which fall within the processing condition range described in the aforementioned embodiments.

In sample 2, a SiOCN film was formed on a wafer using the substrate processing apparatus illustrated in FIG. 1. The processing procedures and processing conditions for producing sample 2 were set similar to the processing procedures and processing conditions for producing sample 1 except that the second thermal annealing step was not performed.

In sample 3, a SiOCN film was formed on a wafer using the substrate processing apparatus illustrated in FIG. 1. The processing procedures and processing conditions for producing sample 3 were set similar to the processing procedures and processing conditions for producing sample 1 except that the hygroscopic-site-eliminating step and the second thermal annealing step were not performed.

Figure 11:
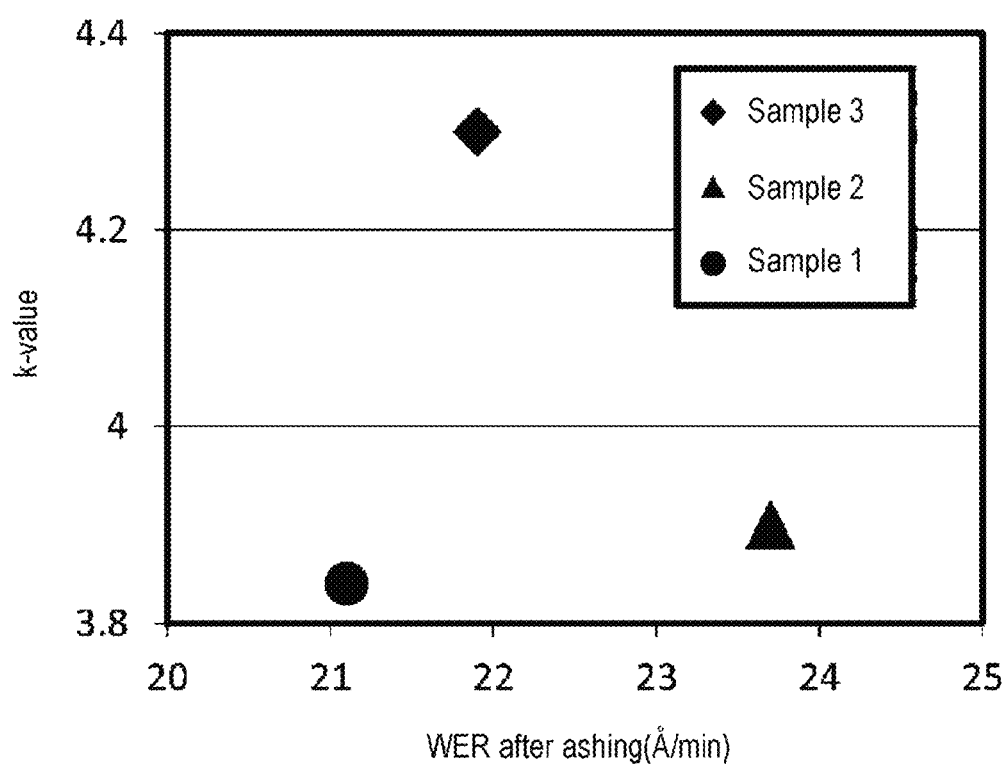
FIG. 11 is a diagram illustrating a dielectric constant of a film formed on a substrate, and a wet etching rate after an ashing process.

Then, after the SiOCN films of samples 1 to 3 were exposed to the atmosphere for a predetermined time, dielectric constants (k-values) of these films and wet etching rates (WER) after the ashing process were each measured. FIG. 11 shows the results. In FIG. 11, the vertical axis indicates a k-value, and the horizontal axis indicates a WER (A/min) after the ashing process. In the drawing, the reference symbols •, ▲, and ♦ indicate samples 1 to 3, respectively.

According to FIG. 11, it can be seen that, the k-values, after exposure to the atmosphere, of the SiOCN films of samples 1 and 2 in which both the hygroscopic-site-eliminating step and the first thermal annealing step were performed are lower than that of the SiOCN film of sample 3 in which the hygroscopic-site-eliminating step was not performed. This is considered to be because the film finally formed on the wafer can be allowed to become a film which contains no hygroscopic site by performing both the hygroscopic-site-eliminating step and the first thermal annealing step in the substrate processing, whereby the moisture absorption after exposure to the atmosphere can be suppressed. Furthermore, it is considered to be because the degree of porosity of the film finally formed on the wafer can be enhanced by performing both the hygroscopic-site-eliminating step and the first thermal annealing step. Moreover, it can be seen that the k-value of the SiOCN film of sample 1 in which the second thermal annealing step was performed is lower than that of the SiOCN film of sample 2 in which the second thermal annealing step was not performed. This is considered to be because most of moisture or impurity can be desorbed from the SiOCN film by performing the first thermal annealing step, but moisture or impurity that could not completely be desorbed at the first thermal annealing step by performing the second thermal annealing step could be further desorbed from the film, and further the film could be cured. Moreover, according to FIG. 11, it can be seen that the SiOCN films of samples 1 to 3 all have excellent WER after the ashing process and all have excellent ashing resistance.

According to the present disclosure in some embodiments, it is possible to improve a quality of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) forming a first film containing boron and at least first bonds selected from the group of Si—C bonds and Si—N bonds on a substrate by performing a cycle a predetermined number of times, the cycle including non-simultaneously performing:
      supplying a boron-containing pseudo-catalyst gas to the substrate; and
      supplying a first precursor gas containing at least the first bonds selected from the group of the Si—C bonds and the Si—N bonds to the substrate;
   (b) modifying the first film to a second film by supplying a gas containing hydrogen and oxygen to the substrate to react one or more hygroscopic sites in the first film with the gas containing hydrogen and oxygen and eliminate the hygroscopic sites; and
   (c) modifying the second film to a third film by performing a thermal annealing process to the second film to desorb moisture in the second film.

2. The method according to claim 1, wherein in (b), at least a hygroscopic site that is formed due to boron among the hygroscopic sites in the first film is eliminated by reacting with the gas containing hydrogen and oxygen.

3. The method according to claim 2, wherein at least one selected from the group of the pseudo-catalyst gas and the first precursor gas further contains chlorine, and the first film further contains chlorine, and wherein in (b), a hygroscopic site that is formed due to the chlorine among the hygroscopic sites in the first film is further eliminated by reacting with the gas containing hydrogen and oxygen.

4. The method according to claim 2, wherein at least one selected from the group of the pseudo-catalyst gas and the first precursor gas further contains hydrogen, and the first film further contains Si—H bonds, and wherein in (b), a hygroscopic site that is formed due to the Si—H bonds among the hygroscopic sites in the first film is further eliminated by reacting with the gas containing hydrogen and oxygen.

5. The method according to claim 1, wherein in (b), the hygroscopic sites are eliminated without breaking at least the first bonds selected from the group of the Si—C bonds and the Si—N bonds in the first film.

6. The method according to claim 1, wherein in at least one selected from the group of (b) and (c), a byproduct generated by a reaction between the hygroscopic sites and the gas containing hydrogen and oxygen is desorbed.

7. The method according to claim 1, wherein in (c), the third film is made porous by maintaining spaces, from which moisture is desorbed in the second film, to become pores.

8. The method according to claim 1, wherein in (c), a film density of the third film is set lower than a film density of each of the first film and the second film.

9. The method according to claim 1, wherein the cycle in (a) further includes performing supplying a second precursor gas containing second bonds, which are different from the first bonds, selected from the group of the Si—C bonds and the Si—N bonds to the substrate, non-simultaneously with the act of supplying the pseudo-catalyst gas and the act of supplying the first precursor gas.

10. The method according to claim 9, wherein the cycle in (a) further includes performing supplying an oxidizing agent to the substrate, non-simultaneously with the act of supplying the pseudo-catalyst gas, the act of supplying the first precursor gas, and the act of supplying the second precursor gas.

11. The method according to claim 1, wherein the cycle in (a) further includes performing supplying an oxidizing agent to the substrate, non-simultaneously with the act of supplying the pseudo-catalyst gas and the act of supplying the first precursor gas.

12. The method according to claim 1, wherein in (c), the thermal annealing process is performed in multiple stages by changing a processing condition.

13. The method according to claim 1, wherein (c) includes:

performing a first thermal annealing process to the second film at a first temperature; and performing a second thermal annealing process to the second film at a second temperature different from the first temperature.

14. The method according to claim 13, wherein the second temperature is set higher than the first temperature, and wherein a second thermal annealing process time is set shorter than a first thermal annealing process time.

15. The method according to claim 13, wherein the first thermal annealing process is performed by a normal thermal annealing process, and the second thermal annealing process is performed by a RTA (rapid thermal annealing) process.

16. The method according to claim 13, wherein the first thermal annealing process is performed using a resistance heater, and the second thermal annealing process is performed using a lamp heater.

17. The method according to claim 13, wherein (a), (b), and the first thermal annealing process are continuously performed in a first process chamber, and the second thermal annealing process is performed in a second process chamber different from the first process chamber.

18. The method according to claim 13, wherein (a) and (b) are continuously performed in a first process chamber, the first thermal annealing process is performed in a second process chamber different from the first process chamber, and the second thermal annealing process is performed in a third process chamber different from the first process chamber and the second process chamber.

19. The method according to claim 1, wherein (a), (b), and (c) are performed in a non-plasma atmosphere.

20. A substrate processing apparatus, comprising:

a process chamber in which a substrate is processed, a pseudo-catalyst gas supply system configured to supply a boron-containing pseudo-catalyst gas to the substrate in the process chamber;

a first precursor gas supply system configured to supply a first precursor gas containing at least first bonds selected from the group of Si—C bonds and Si—N bonds to the substrate in the process chamber;

a hydrogen-and-oxygen-containing gas supply system configured to supply a gas containing hydrogen and oxygen to the substrate in the process chamber;

a heater configured to heat the substrate in the process chamber; and a controller configured to control the pseudo-catalyst gas supply system, the first precursor gas supply system, the hydrogen-and-oxygen-containing gas supply system, and the heater so as to perform a process, the process including:

(a) forming a first film containing boron and at least the first bonds selected from the group of the Si—C bonds and the Si—N bonds on the substrate by performing a cycle a predetermined number of times, the cycle including non-simultaneously performing:

supplying the pseudo-catalyst gas to the substrate; and supplying the first precursor gas to the substrate;

(b) modifying the first film to a second film by supplying the gas containing hydrogen and oxygen to the substrate to react one or more hygroscopic sites in the first film with the gas containing hydrogen and oxygen and eliminate the hygroscopic sites; and (c) modifying the second film to a third film by performing a thermal annealing process to the second film to desorb moisture in the second film.

21. A non-transitory computer-readable recording medium storing a program that causes, by a computer, a substrate processing apparatus to perform a process in a process chamber of the substrate processing apparatus, the process comprising:

(a) forming a first film containing boron and at least first bonds selected from the group of Si—C bonds and Si—N bonds on a substrate by performing a cycle a predetermined number of times, the cycle including non-simultaneously performing supplying a boron-containing pseudo-catalyst gas to the substrate; and supplying a first precursor gas containing at least the first bonds selected from the group of the Si—C bonds and the Si—N bonds to the substrate;

(b) modifying the first film to a second film by supplying a gas containing hydrogen and oxygen to the substrate to react one or more hygroscopic sites in the first film with the gas containing hydrogen and oxygen and eliminate the hygroscopic sites; and (c) modifying the second film to a third film by performing a thermal annealing process to the second film to desorb moisture in the second film.

\* \* \* \* \*